United States Patent
Saito et al.

(10) Patent No.: US 6,932,884 B2
(45) Date of Patent: Aug. 23, 2005

(54) SUBSTRATE PROCESSING APPARATUS

(75) Inventors: Takayuki Saito, Fujisawa (JP); Tsukuru Suzuki, Fujisawa (JP); Yuji Makita, Fujisawa (JP); Kaoru Yamada, Fujisawa (JP); Mitsuhiko Shirakashi, Tokyo (JP); Kenya Ito, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/233,467

(22) Filed: Sep. 4, 2002

(65) Prior Publication Data

US 2003/0041968 A1 Mar. 6, 2003

(30) Foreign Application Priority Data

Sep. 5, 2001 (JP) ........................................ 2001-268487

(51) Int. Cl.[7] ........................ C23F 1/00; H01L 21/306; A47L 15/00; A47L 25/00; C25D 17/00
(52) U.S. Cl. ............................ 156/345.17; 156/345.33; 156/345.15; 156/345.11; 15/77; 204/198
(58) Field of Search ............................ 15/77; 118/715; 156/345.1, 345.33, 345.34, 345.35, 345.36, 345.17, 345.21, 345.11

(56) References Cited

U.S. PATENT DOCUMENTS

| | | | | |
|---|---|---|---|---|
| 5,608,943 A | * | 3/1997 | Konishi et al. | ............... 15/302 |
| 6,136,163 A | * | 10/2000 | Cheung et al. | ............. 204/198 |
| 6,225,235 B1 | | 5/2001 | Kunze-Concewitz | ........ 438/745 |
| 6,379,235 B1 | * | 4/2002 | Halley | ........................ 451/397 |
| 6,385,805 B2 | * | 5/2002 | Konishi et al. | ................ 15/77 |
| 6,585,876 B2 | * | 7/2003 | Dordi et al. | ................ 205/148 |
| 2001/0017191 A1 | * | 8/2001 | Hashimoto et al. | ......... 156/345 |
| 2001/0037858 A1 | | 11/2001 | Taniyama et al. | ...... 156/345.21 |

FOREIGN PATENT DOCUMENTS

| | | |
|---|---|---|
| EP | 0 368 334 | 5/1990 |
| EP | 0 677 867 | 10/1995 |

* cited by examiner

Primary Examiner—Rudy Zervigon
(74) Attorney, Agent, or Firm—Wenderoth, Lind & Ponack, L.L.P.

(57) ABSTRACT

A substrate processing apparatus comprises roll chucks for holding and rotating a substrate, a closable chamber housing the roll chucks therein, and a gas introduction pipe for introducing a gas into the chamber. The substrate processing apparatus further comprises an etching unit for etching and cleaning a peripheral portion of the substrate while the substrate is being rotated by the roll chucks, and a first supply passage for supplying a first liquid to the etching unit.

28 Claims, 7 Drawing Sheets

SUBSTRATE PROCESSING APPARATUS

BACKGROUND OF THE INVENTION

1. Field of the Invention

The present invention relates to a substrate processing apparatus and a substrate processing method, and more particularly to a substrate processing apparatus suitable for use in etching or cleaning a peripheral portion or an opposite surface of a semiconductor substrate at a high level of cleanliness.

2. Description of the Related Art

In recent years, attention has been drawn to technologies for embedding an interconnection material in trenches on semiconductor substrates to form damascene interconnections of copper, for example. It has also been attempted in the art to form capacitor electrodes having a high dielectric constant in semiconductor substrates. In either case, a desired metal or metal compound is deposited as a thin film on a surface of a semiconductor substrate by sputtering or the like. At this time, the thin film is deposited not only on the surface of the semiconductor substrate, but also on a bevel portion of a peripheral portion and an opposite surface of the semiconductor substrate. Contamination of the bevel portion and the opposite surface with metal or a metal compound results in contamination of a robot arm, which holds and moves the semiconductor substrate, and a cassette which accommodates the semiconductor substrate during a process of transferring the semiconductor substrate to a subsequent processing step. Eventually, metal contamination spreads throughout an overall LSI fabrication process. Particularly, copper would pose an extremely serious problem during a heat treatment process because copper has a high coefficient of diffusion into a silicon oxide film, which is on the semiconductor substrate.

Heretofore, it has been customary to clean a bevel portion of a semiconductor substrate by supplying a liquid mixture of hydrofluoric acid or hydrochloric acid and hydrogen peroxide to the bevel portion from an opposite side of the semiconductor substrate, blowing a nitrogen gas to a surface of the semiconductor substrate to prevent the liquid mixture from flowing onto the surface of the semiconductor substrate, and controlling an etched depth of the bevel portion.

However, the above process is disadvantageous in that a large amount of nitrogen gas has to be supplied to prevent the liquid mixture from flowing onto the surface of the semiconductor substrate, and in that the liquid mixture needs to be supplied also in a large amount to clean the bevel portion. In presence of water and oxygen, copper instantly forms oxides. A tendency of copper to form oxides becomes more significant, particularly during a substrate drying step. Oxides of copper thus formed are mainly a mixture of cupric oxide and copper carbonate, and are likely to greatly increase a specific electric resistance of interconnections.

SUMMARY OF THE INVENTION

It is an object of the present invention to provide a substrate processing apparatus which can efficiently process a peripheral portion of a substrate, while protecting the substrate, by supplying a relatively small amount of gas thereto.

Another object of the present invention is to provide a substrate processing apparatus which can efficiently process a surface or an opposite surface of a substrate with a relatively small amount of processing fluid.

According to a first aspect of the present invention, there is provided a substrate processing apparatus for processing a substrate comprising: a chuck assembly for holding and rotating the substrate; a closable chamber housing the chuck assembly therein; a gas introduction passage for introducing a gas into the chamber; a processing unit for processing a peripheral portion of the substrate while the substrate is being rotated by the chuck assembly; and a first supply passage for supplying a first liquid to the processing unit. Typically, the substrate has a circular shape.

The substrate may be a semiconductor substrate, for example. The closable chamber typically refers to a chamber having an inner space which can be isolated from an external space. The processing unit should preferably be arranged to simultaneously process a peripheral portion of the substrate on its surface, outer edge, and opposite surface. The peripheral portion of the substrate is typically constructed as a bevel. The first liquid is typically an etching liquid, but also covers pure water for cleaning an etched substrate.

Since the closable chamber has the gas introduction passage, an interior of the chamber can be filled with gas introduced through the gas introduction passage. When the gas comprises an inert gas, oxygen in the chamber may be purged (removed) and replaced with the inert gas.

According to a second aspect of the present invention, there is provided a substrate processing apparatus for processing a substrate comprising: a chuck assembly for holding and rotating a substrate; a processing unit for processing a peripheral portion of the substrate while the substrate is being rotated by the chuck assembly; a first supply passage for supplying a first liquid to the processing unit; a flat plate disposed parallel to a surface or opposite surface of the substrate; and a second supply passage for supplying at least one of a second liquid for processing the substrate, and a gas for protecting the substrate, to a gap between the surface or opposite surface of the substrate and the flat plate.

The flat plate may be disposed along one or both of the surface and opposite surface of the substrate. The flat plate is effective to reduce an amount of the second liquid or a gas supplied to the gap to a relatively small amount. The flat plate also allows the second liquid or gas to be uniformly brought into contact with the substrate.

According to a preferred aspect of the present invention, the substrate processing apparatus according to the second aspect further comprises: a closable chamber housing the chuck assembly therein; and a gas introduction passage for introducing a gas into the chamber.

The chamber may have a gas discharge pipe connected to a gas discharge duct, and also may have a function to automatically open and close a portion of the chamber when a substrate is loaded into and unloaded from the chamber.

The substrate processing apparatus may have a liquid discharge pipe for discharging liquid used in the processing unit, and a liquid discharge pipe for discharging liquid supplied to a gap between a substrate and the flat plate. These liquid discharge pipes may be combined into one liquid discharge pipe.

According to a preferred aspect of the present invention, the gas introduction passage comprises: a first gas introduction pipe which is opened at a surface of a substrate; a first gas nozzle connected to the first gas introduction pipe; a second gas introduction pipe which is opened at an opposite surface of the substrate, wherein the first gas introduction pipe and the second gas introduction pipe are independent of each other; and a second gas nozzle connected to the second gas introduction pipe.

According to a preferred aspect of the present invention, the substrate processing apparatus further comprises: a first pure water nozzle which is opened at the surface of the substrate; and a second pure water nozzle which is opened at the opposite surface of the substrate, wherein the first pure water nozzle and the second pure water nozzle are independent of each other. These pure water nozzles may be shared by the above first and second gas nozzles.

According to a preferred aspect of the present invention, the first liquid comprises one or both of a mineral acid and an organic acid, or an oxidizing agent.

According to a preferred aspect of the present invention, the second liquid comprises one or both of a mineral acid and an organic acid, or an oxidizing agent.

According to a preferred aspect of the present invention, the first or second liquids can comprise one or both of a mineral acid and an organic acid, and an oxidizing agent, which are supplied alternately.

According to a preferred aspect of the present invention, the gas comprises an inert gas. The inert gas is a nitrogen gas or a noble gas such as an argon gas. The inert gas is brought into contact with a substrate to purge oxygen, for example, for thereby protecting the substrate.

According to a preferred aspect of the present invention, the processing unit etches or cleans the peripheral portion of the substrate.

According to another aspect of the present invention, there is provided a method of processing a substrate, comprising: rotating a substrate; processing a peripheral portion of the substrate while the substrate is being rotated; supplying a gas around the substrate; and drying the substrate while the gas is being supplied around the substrate.

The peripheral portion of the substrate should preferably be processed simultaneously on its surface, outer edge, and opposite surface. The gas should preferably be supplied to the surface and opposite surface of the substrate. When the peripheral portion of the substrate is processed, a liquid containing one or both of a mineral acid and an organic acid may be supplied to the peripheral portion of the substrate. Alternatively, a liquid containing an oxidizing agent may be supplied to the peripheral portion of the substrate. The oxidizing agent comprises aqueous hydrogen peroxide, ozone water, or the like, and the liquid contains at least one of these oxidizing agents. The gas may comprise an inert gas of a nitrogen gas or a noble gas such as an argon gas.

According to a preferred aspect of the present invention, processing comprises etching or cleaning the peripheral portion of the substrate.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
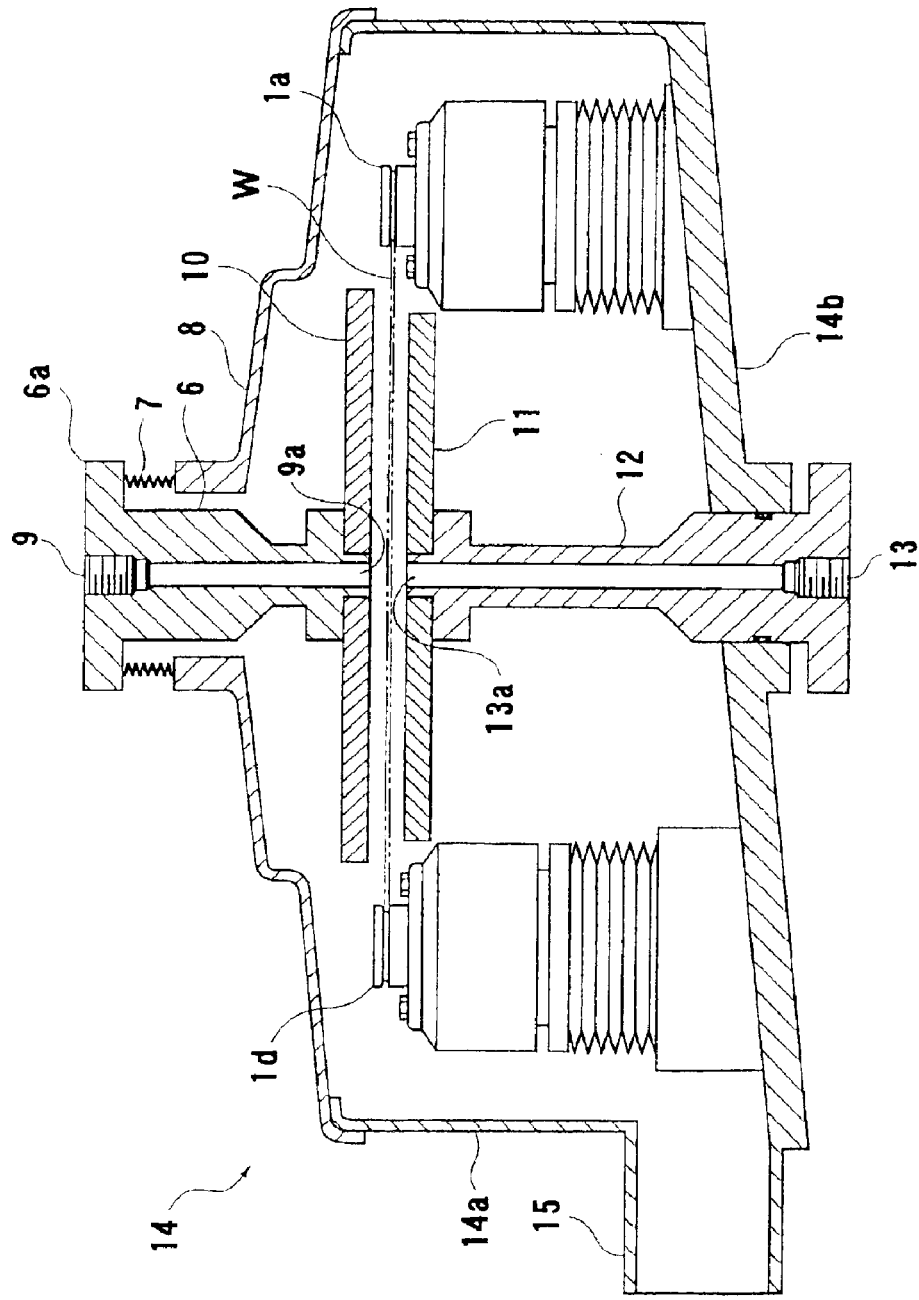
FIG. 1 is a cross-sectional front view showing a substrate cleaning device as a substrate processing apparatus according to an embodiment of the present invention.

A substrate processing apparatus according to embodiments of the present invention will be described below with reference to the accompanying drawings. Like or corresponding parts are denoted by like or corresponding reference numerals throughout the drawings, and will not be described below repetitively. Embodiments which will be described below are given for illustrative purposes only, and the present invention is not limited to these illustrated embodiments.

FIG. 1 is a cross-sectional view showing a substrate processing apparatus according to an embodiment of the present invention. In the present embodiment, the substrate processing apparatus serves as a substrate cleaning device for etching and cleaning a substrate such as a semiconductor wafer. The substrate processing apparatus has a chamber 14 and a mechanism for etching and cleaning a wafer W housed in the chamber 14. As shown in FIG. 1, the chamber 14 comprises a cylindrical chamber housing 14a and a chamber cover 8 for covering an upper end of the chamber housing 14a. The cylindrical chamber housing 14a extends vertically, and a lower end of the chamber housing 14a is closed by a bottom panel 14b. The chamber cover 8 is in a shape of an inverted cup and covers the upper end of the cylindrical chamber housing 14a. The upper end of the cylindrical chamber housing 14a and an outer circumferential edge of the chamber cover 8 are held in intimate contact with each other, for thereby sealing an interior of the chamber 14 from an external space.

The bottom panel 14b is slightly slanted with respect to a horizontal plane. The chamber 14 has a gas/liquid discharge pipe 15 for discharging gas and liquid from the chamber 14. The gas/liquid discharge pipe 15 is connected to the chamber housing 14a at a connecting portion of the bottom panel 14b and the chamber housing 14a, which is a lowest end of the slant of the bottom panel 14b.

The chamber cover 8 has an opening defined in a central portion thereof. The chamber 14 has an upper shaft 6 extending vertically through this central opening defined in the central portion of the chamber cover 8. The upper shaft 6 has a circular flange 6a provided at its upper end. An upper end of the chamber cover 8, where the central opening is defined, and the circular flange 6a are connected in a sealed manner to each other by a bellows-shaped flexible joint 7.

The upper shaft 6 has a first introduction pipe 9 (supply passage) defined axially centrally therethrough. The first introduction pipe 9 serves to introduce and supply a gas such as a nitrogen gas into the chamber 14 for purging oxygen. The first introduction pipe 9 also serves as a supply passage for supplying ultra pure water to a surface of the wafer W for rinsing the wafer W. The first introduction pipe 9 has a lower end serving as a nozzle 9a which faces the wafer W.

The chamber cover 8 and the upper shaft 6 are connected to each other by a connector (not shown) which allows the chamber cover 8 and the upper shaft 6 to be vertically positionally adjusted relative to each other. The connector has an actuator (not shown) for moving the upper shaft 6 with respect to the chamber cover 8 for adjusting their relative position. The bellows-shaped flexible joint 7 is so flexible as to absorb changes in a relative position of the chamber cover 8 and the upper shaft 6.

The upper shaft 6 has an upper disk 10 in a form of a circular flat plate which is horizontally formed integrally with or mounted on a lower end of the upper shaft 6. The upper disk 10 has a lower surface facing the wafer W and being parallel therewith. It is desirable that a gap between the upper disk 10 and the wafer W be as small as possible. The gap may be adjustable in a range from 0.5 to 20 mm, for example. The gap between the upper disk 10 and the wafer W should preferably be in a range from 0.8 to 10 mm, or more preferably be in a range from 1 to 4 mm, for allowing a nitrogen gas or ultra pure water supplied through the first introduction pipe 9 to flow uniformly over the surface of the wafer W. Adjustment of the gap serves a purpose of processing or protecting the substrate with a relatively small amount of fluid. The gap may be adjusted by adjusting the relative position of the chamber cover 8 and the upper shaft 6.

The bottom panel 14b has six openings (not shown) defined therein, and six roll chucks 1a through 1f extending vertically upwardly through respective openings for holding the wafer W horizontally. The six roll chucks 1a through 1f rotate about their own axes to rotate the wafer W held thereby. The roll chucks 1a through 1f rotate at a maximum rotational speed of 300 rev/min so that the wafer W can uniformly be rotated at a low rotational speed while being held by the roll chucks 1a through 1f.

The bottom panel 14b has a lower shaft 12 mounted thereon at a position below an opposite side of the wafer W such that the lower shaft extends vertically upwardly. The lower shaft 12 has a lower end fitted into an opening defined in the bottom panel 14b. The lower shaft 12 has a second introduction pipe (supply passage) 13 defined axially centrally therethrough. The second introduction pipe 13 has an upper end serving as a nozzle 13a which faces the opposite side of the wafer W.

The lower shaft 12 has a lower disk 11 in a form of a circular flat plate which is horizontally formed integrally with or mounted on an upper end of the lower shaft 12. The lower disk 11 has an upper surface facing the opposite side of the wafer W held by the roll chucks 1a through 1f, and is parallel with the wafer W. It is desirable that a gap between the lower disk 11 and the wafer W be as small as possible, as in the case of an analogous relationship between the upper disk 10 and the wafer W. The gap may be adjustable in a range from 0.5 to 20 mm, for example. The gap between the lower disk 11 and the wafer W should preferably be in a range from 0.8 to 10 mm, or more preferably be in the range from 1 to 4 mm, for allowing a nitrogen gas or ultra pure water supplied through the second introduction pipe 13 to flow uniformly over the opposite surface of the wafer W. Adjustment of the gap serves a purpose of processing or protecting the wafer with a relatively small amount of fluid.

Figure 2A:
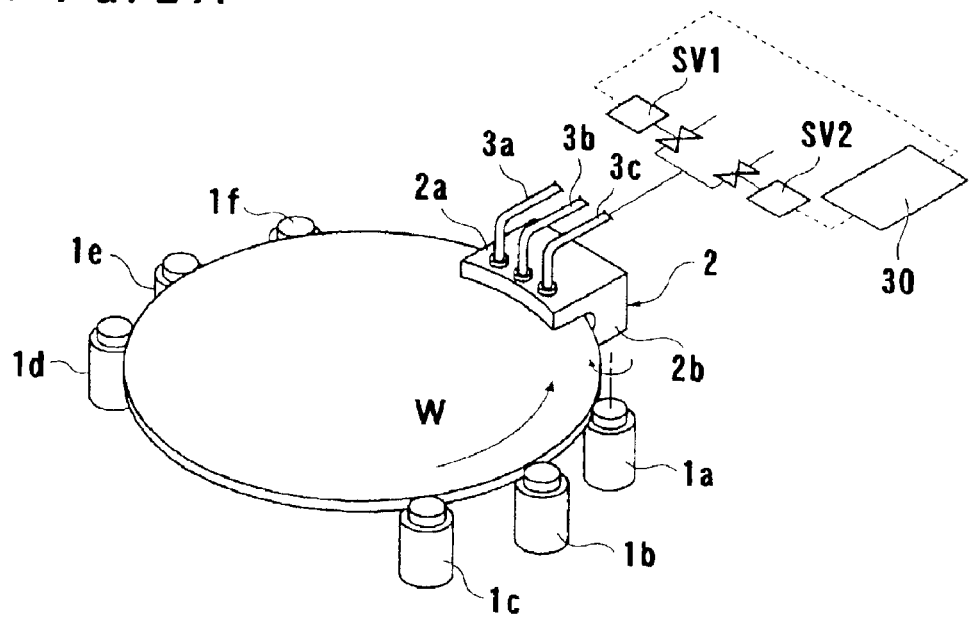
FIG. 2A is a perspective view showing roll chucks and an etching unit in the substrate cleaning device shown in FIG. 1.
Figure 2B:
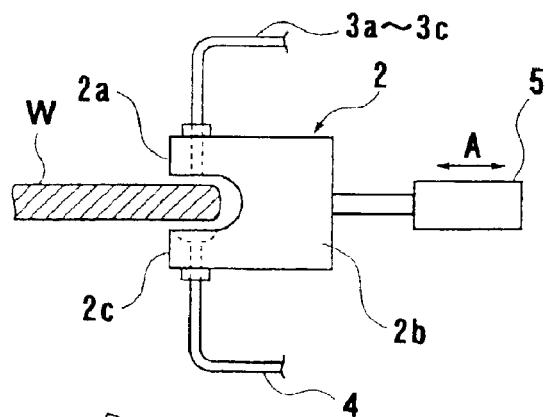
FIG. 2B is a side elevational view of the etching unit shown in FIG. 2A.
Figure 2C:
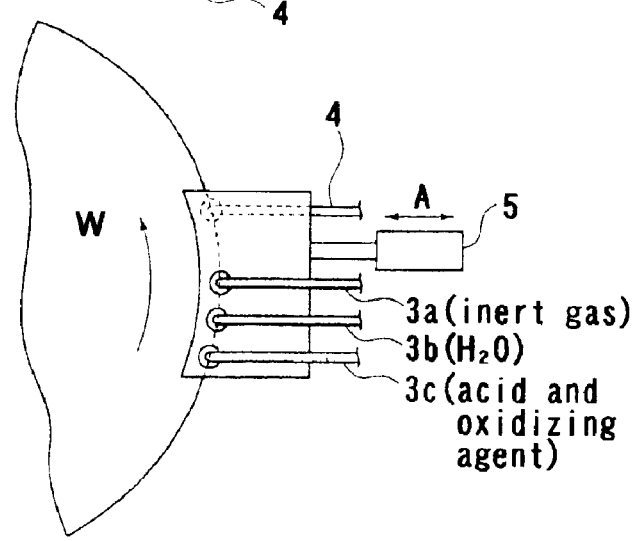
FIG. 2C is a plan view of the etching unit shown in FIG. 2A.

In the present embodiment, the substrate processing apparatus has an etching unit, as a processing unit, for etching a bevel portion (i.e., a peripheral portion) of the wafer, which is circular. An example of the etching unit will be described below with reference to FIGS. 2A through 2C. FIG. 2A is a perspective view showing a relationship between the wafer W held by the roll chucks 1a through 1f and the etching unit 2, FIG. 2B is a side view of the etching unit 2, and FIG. 2C is a plan view of the etching unit 2. FIGS. 2B and 2C show the etching unit 2 and a portion of the wafer W near the etching unit 2.

The peripheral portion of the wafer means an area on a periphery thereof which contains no circuit therein, or an area on a periphery thereof which contains a circuit but will not finally be used as a chip. Typically, corners of a peripheral edge at the surface and opposite surface of the wafer are chamfered or rounded. Since a chamfered or rounded peripheral portion is in a bevel form, such a portion is referred to as a bevel portion of the wafer.

As shown in FIG. 2B, the etching unit 2 comprises a hook-shaped member formed so as to face the surface and opposite surface of the peripheral portion of the wafer W in such a state that gaps are formed between the wafer W and the hook-shaped member. Specifically, the etching unit 2 has an upper cantilever 2a as an upper horizontal portion of the hook-shaped member, a lower cantilever 2c as a lower horizontal portion of the hook-shaped member, and a vertical joint 2b interconnecting the upper cantilever 2a and the lower cantilever 2b and serving as a vertical portion of the hook-shaped member. Since the hook-shaped member surrounds the peripheral portion of the wafer W, the peripheral portion of the wafer W can be etched, cleaned, dried, or otherwise processed simultaneously on its surface, outer circumferential edge, and opposite surface. When gaps between the wafer W and inner surfaces of the hook-shaped member are set to be small, an amount of processing fluids supplied from the etching unit 2 may be so reduced that they will ooze out onto the wafer W.

As shown in FIGS. 2A, 2B and 2C, an outer surface of the upper cantilever 2a, which is remote from the wafer W, is connected to a gas supply pipe 3a for supplying a gas such as a nitrogen gas to dry the wafer W, an ultra pure water supply pipe 3b for supplying ultra pure water to clean the wafer W, and a chemical liquid supply pipe 3c (supply passage) for supplying a chemical liquid, e.g., a hydrofluoric acid or the like, as a first liquid to etch a thin metal film formed on the bevel portion of the wafer W. The gas supply pipe 3a, the ultra pure water supply pipe 3b, and the chemical liquid supply pipe 3c are disposed successively upstream in the order named in a direction of rotation of the wafer W. The gas supply pipe 3a, the ultra pure water supply pipe 3b, and the chemical liquid supply pipe 3c extend through the upper cantilever 2a and supply the gas, the ultra pure water, and the chemical liquid to the bevel portion of the wafer W, respectively.

The chemical liquid supplied from the chemical liquid supply pipe 3c comprises a mineral acid or an organic acid as an etching liquid, or an oxidizing agent. The mineral acid may be hydrofluoric acid (HF), hydrochloric acid (HCl), nitric acid ($HNO_3$), sulfuric acid ($H_2SO_4$), or the like. The chemical liquid may contain at least one of these acids. The organic acid may be acetic acid, formic acid, oxalic acid, or the like. The chemical liquid may contain at least one of these acids. The oxidizing agent may be aqueous hydrogen peroxide ($H_2O_2$), ozone ($O_3$) water, or the like. The chemical liquid may contain at least one of these oxidizing agents. The chemical solution is supplied so as to ooze out from the chemical liquid supply pipe 3c onto the wafer W. A second liquid to be described later is supplied in a similar manner.

If a thin metal film formed on the bevel portion of the wafer W is made of copper, then it can be etched under such conditions as an acid environment with an oxidation-reduction potential of at least +200 mV vs. SHE (Standard Hydrogen Electrode), or preferably an oxidation-reduction potential of at least +500 mV vs. SHE. An oxidation-reduction potential of an acid solution is about +200 mV vs. SHE. Therefore,in a case where only an acid is used, an etching rate is not increased even when concentration of the acid is increased. However, when an acid is mixed with an oxidizing agent to increase an oxidation-reduction potential, an etching rate is greatly increased. Therefore, an etching liquid should preferably be a mixture of an acid and an oxidizing agent. An acid and an oxidizing agent may not necessarily be mixed with each other, but may be supplied alternately onto the thin metal film for the same purpose.

A structure for alternately supplying an acid and an oxidizing agent as liquids to a thin metal film will be described below with reference to FIG. 2A. As shown in FIG. 2A, a solenoid-operated valve SV1 as an on-off valve for supplying an acid and a solenoid-operated valve SV2 as an on-off valve for supplying an oxidizing agent are disposed in parallel with each other at an upstream side of the chemical liquid supply pipe 3c. The solenoid-operated valve SV1 and the solenoid-operated valve SV2 are connected through respective supply passages jointly to the chemical liquid supply pipe 3c. The solenoid-operated valve SV1 and the solenoid-operated valve SV2 are controlled for their opening and closing by a controller 30 which is electrically connected thereto.

The controller 30 controls a time to open and close the solenoid-operated valves SV1, SV2, and a sequence to open and close the solenoid-operated valves SV1, SV2. A type and concentration of acid used are selected depending on a type of thin metal film. The sequence of acid and oxidizing agent to be supplied to the etching unit 2, and the time to supply the acid and the oxidizing agent to the etching unit 2 are set in the controller 30, so that the acid and the oxidizing agent can be supplied alternately to the etching unit 2 under desired conditions. The controller 30 may be set to supply the acid and the oxidizing agent simultaneously in a mixed state.

The solenoid-operated valve SV1, SV2, which can be fully opened or fully closed, may be replaced with regulating valves capable of providing intermediate openings. In such a case, the controller 30 can adjust rates of acid and oxidizing agent to achieve a desired mixing ratio.

The ultra pure water supply pipe 3b supplies ultra pure water for cleaning the wafer W. The gas supply pipe 3a supplies an inert gas such as $N_2$ or Ar for drying the wafer W.

As shown in FIGS. 2B and 2C, an outer surface of the lower cantilever 2c, which is remote from the wafer W, is connected to a liquid discharge pipe 4 for discharging waste liquid of the chemical liquid and the ultra pure water to an exterior of the chamber 14. The liquid discharge pipe 4 extends through the lower cantilever 2c.

As shown in FIG. 2B, an outer surface of the vertical joint 2b of the etching unit 2, which is remote from the wafer W, is connected to an air cylinder 5 by a horizontal shaft. The air cylinder 5 is actuated so as to move the etching unit 2 via the shaft toward and away from the wafer W as indicated by arrow A. With this arrangement, the etching unit 2 can be retracted away from the wafer W when the wafer W is loaded and unloaded, i.e., when the wafer W is placed on and removed from the roll chucks 1a through 1f.

Figure 3:
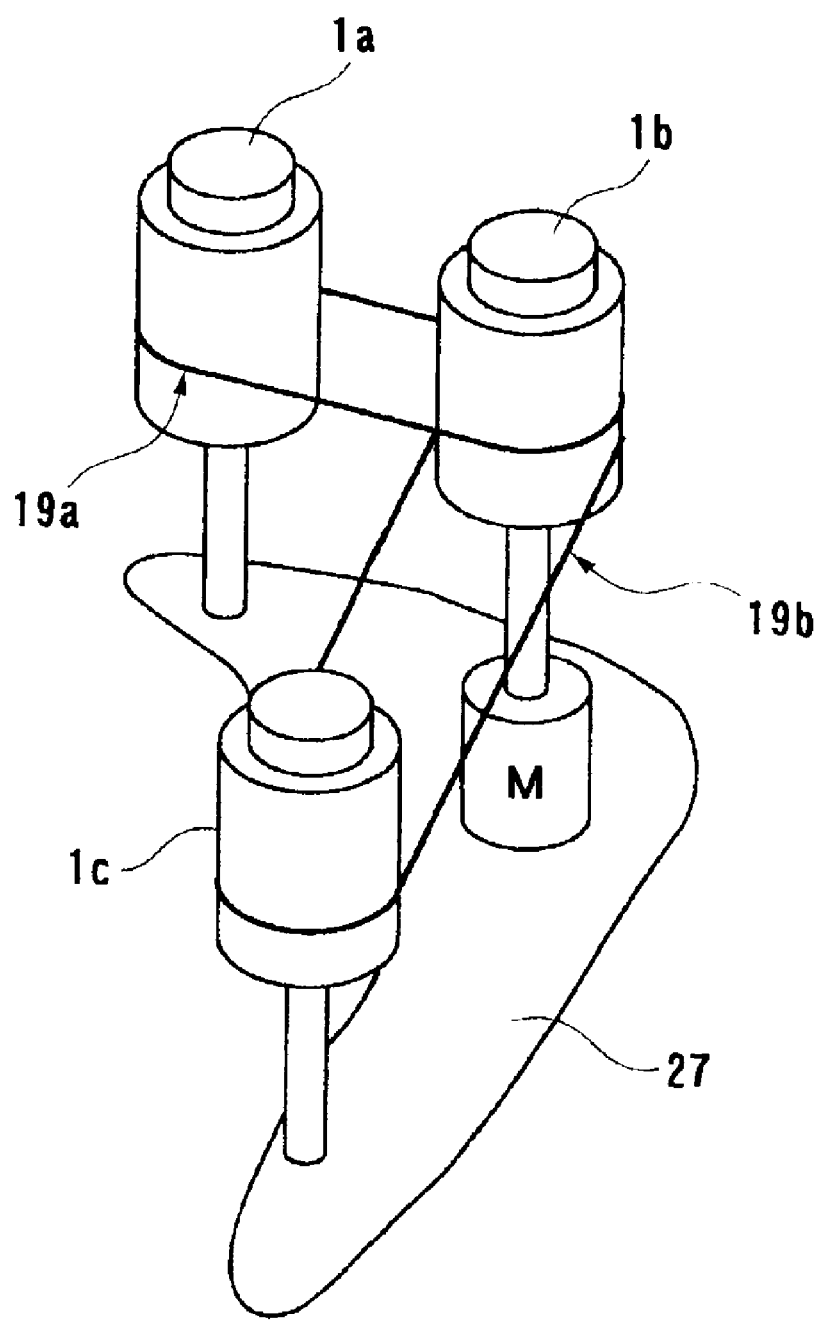
FIG. 3 is a perspective view showing the roll chucks in the substrate cleaning device shown in FIG. 1.

An example of the roll chucks 1a through 1f will be described below with reference to FIG. 3. In FIG. 3, only roll chucks 1a, 1b, 1c are shown from among the roll chucks 1a through 1f. The other roll chucks 1d, 1e, 1f are identical in structure to the roll chucks 1a, 1b, 1c and will not be described below. As shown in FIG. 3, a motor M is directly coupled to central roll chuck 1b, and is fixedly mounted on a base 27. The other roll chucks 1a, 1c are rotatably supported on respective support shafts that are fixedly mounted on the base 27. These support shafts extend through openings defined in the bottom panel 14b (not shown in FIG. 3).

The central roll chuck 1b and the other roll chucks 1a, 1c are operatively connected via drive belts 19a, 19b, respectively. With this arrangement, when the central roll chuck 1b is rotated in one direction by the motor M, the roll chucks 1a, 1c are rotated in the same direction by the drive belts 19a, 19b. The motor M may be coupled to either one of the roll chucks 1a, 1c, rather than the central roll chuck 1b.

An etching unit used in a substrate processing apparatus according to another embodiment of the present invention will be described below with reference to FIGS. 4A and 4B.

Figure 4A:
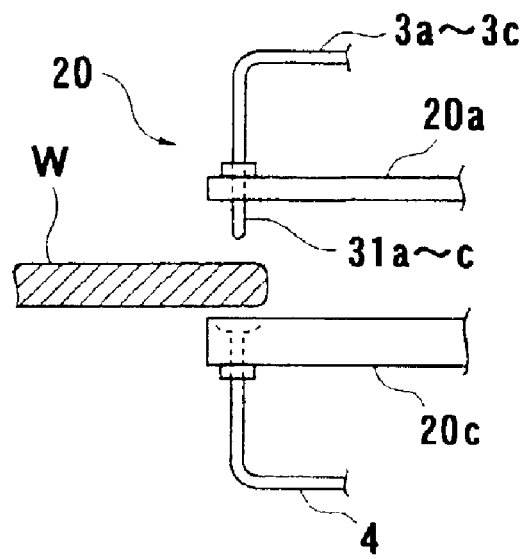
FIG. 4A is a side elevational view showing an etching unit according to another embodiment of the present invention.

As shown in FIG. 4A, an etching unit 20 comprises an upper cantilever 20a extending horizontally and disposed above a peripheral portion of wafer W, and a lower cantilever 20b extending horizontally and disposed below the peripheral portion of the wafer W.

Figure 4B:
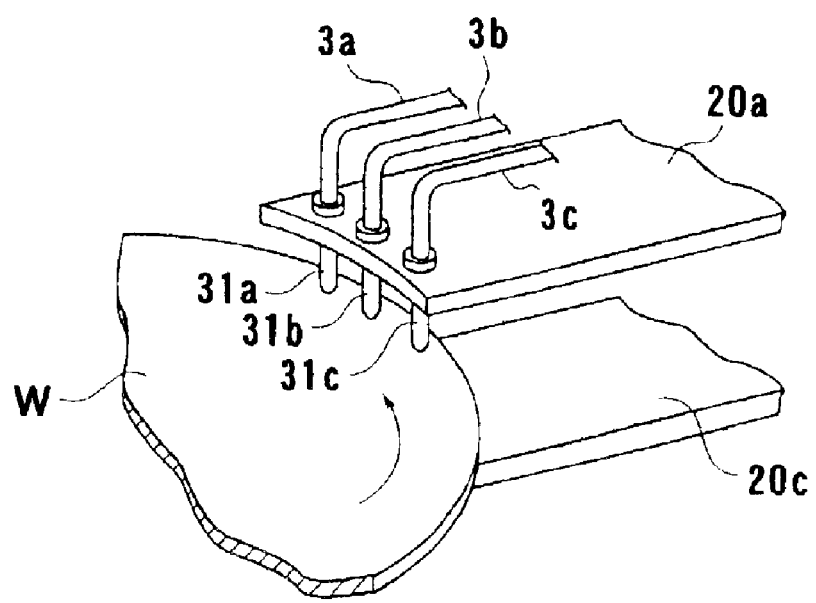
FIG. 4B is a perspective view of the etching unit shown in FIG. 4A.

As shown in FIG. 4B, an outer surface of the upper cantilever 20a is connected to a gas supply pipe 3a for supplying a gas such as a nitrogen gas to dry the wafer W, an ultra pure water supply pipe 3b for supplying ultra pure water to clean the wafer W, and a chemical liquid supply pipe 3c (supply passage) for supplying a chemical liquid, e.g., a hydrofluoric acid or the like, to etch a thin metal film formed on a bevel portion of the wafer W. The gas supply pipe 3a, the ultra pure water supply pipe 3b, and the chemical liquid supply pipe 3c are disposed successively upstream in the order named in a direction of rotation of the wafer W, and extend through the upper cantilever 20a. Lower ends of these supply pipes 3a, 3b, 3c are connected respectively to a gas nozzle 31a, an ultra pure water nozzle 31b, and a chemical liquid nozzle 31c which face the wafer W.

As shown in FIG. 4A, an outer surface of the lower cantilever 20c, which is remote from the wafer W, is connected to a liquid discharge pipe 4 for discharging waste liquid of the chemical liquid and the ultra pure water to an exterior of the chamber 14. The liquid discharge pipe 4 extends through the lower cantilever 20c.

The upper cantilever 20a and the lower cantilever 20c are interconnected by a vertical joint (not shown), as in the case of the etching unit shown in FIG. 2B. An outer surface of the vertical joint of the etching unit 20, which is remote from the wafer W, is connected to an air cylinder (similar to the air cylinder 5 shown in FIG. 2B) by a shaft (not shown). The air cylinder is actuated so as to move the etching unit 20 horizontally via the shaft toward and away from the wafer W. With this arrangement, the etching unit 20 can be retracted away from the wafer W when the wafer W is loaded and unloaded.

An etching unit used in a substrate processing apparatus according to still another embodiment of the present invention will be described below with reference to FIGS. 5A and 5B.

Figure 5A:
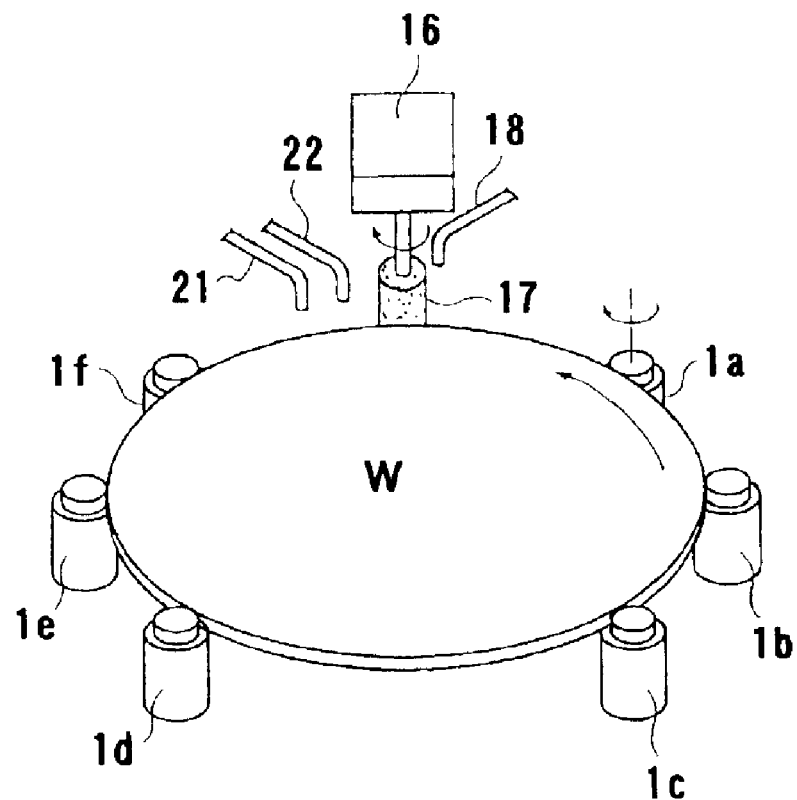
FIG. 5A is a perspective view showing an etching unit according to still another embodiment of the present invention.
Figure 5B:
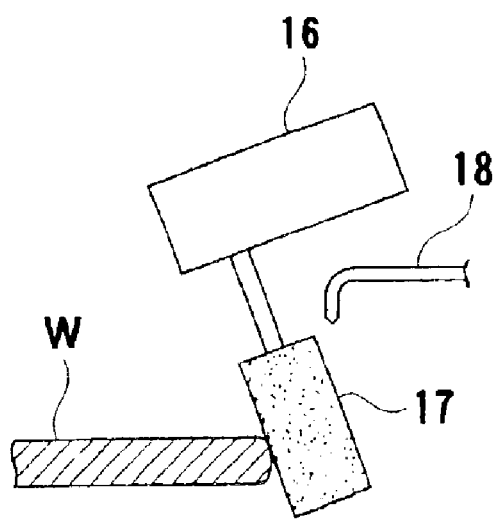
FIG. 5B is a side elevational view of the etching unit shown in FIG. 5A.

As shown in FIGS. 5A and 5B, the etching unit has a chemical liquid applicator in a form of a porous roll 17. The porous roll 17 is obliquely held in contact with a bevel portion of circular wafer W. which is supported by roll chucks 1a through 1f. The porous roll 17 has a shaft directly coupled to a servomotor 16, which rotates the porous roll 17 in such a state that the porous roll 17 is held in contact with the bevel portion of the wafer W.

A chemical liquid nozzle 18 for supplying a chemical liquid is disposed vertically above the porous roll 17. The chemical liquid nozzle 18 supplies a chemical liquid to the porous roll 17 so that the chemical liquid soaks into the porous roll 17.

An ultra pure water nozzle 22 and a gas nozzle 21 are successively disposed downstream of the porous roll 17 in the order named in a direction of rotation of the wafer W. The ultra pure water nozzle 22 and the gas nozzle 21 are oriented toward the bevel portion of the wafer W. The ultra pure water nozzle 22 supplies ultra pure water to the wafer W to clean the wafer W. The gas nozzle 21 ejects a nitrogen gas toward the wafer W to dry the wafer W.

Figure 6:
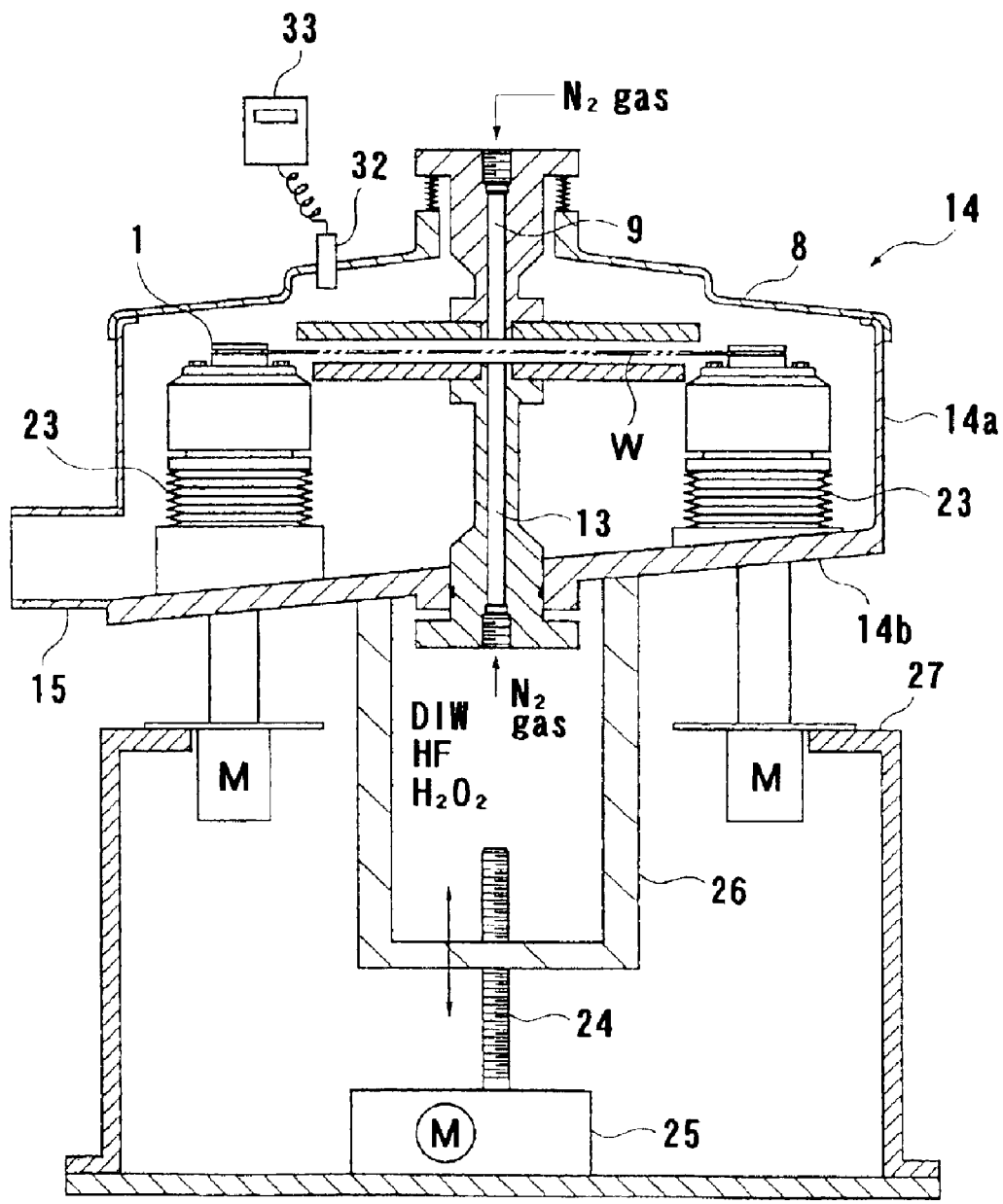
FIG. 6 is a cross-sectional front view showing a mechanism for opening and closing a chamber in the substrate cleaning device shown in FIG. 1.

A mechanism for opening and closing the chamber 14 will be described below for its structure and operation with reference to FIG. 6. As shown in FIG. 6, a vertical arm 26 is mounted on and extends downwardly from the bottom panel 14b of the chamber housing 14a. The arm 26 has a horizontal plate on its lower end which has an internally threaded hole defined therein. An externally threaded vertical rod 24 extends through the internally threaded holes, in the horizontal plate of the arm 26, and is threaded therein. The externally threaded vertical rod 24 has a lower end rotatably connected to a drive shaft of a servomotor 25 which is fixedly mounted on the base 27.

When the externally threaded vertical rod 24 is rotated about its own axis by the servomotor 25, the arm 26 is vertically moved to lift or lower the chamber housing 14a.

The chamber cover 8 is fixed to the base 27 by a support mechanism (not shown). When the chamber housing 14a is moved downwardly, a space is created between the chamber cover 8 and the chamber housing 14a. The wafer W can be loaded into and unloaded from the chamber housing 14a through this created space.

As described above, the shafts of the roll chucks 1a through 1f extend through the respective openings defined in the bottom panel 14b and are supported on the base 27. The roll chucks 1a through 1f and the bottom panel 14b are connected to each other by respective bellows-shaped flexible joints 23. The flexible joints 23 isolate and seal an interior of the chamber 14 from an external space. Joints between the roll chucks 1a through 1f, which rotate about their own axes, and the flexible joints 23 are sealed by mechanical seals (not shown).

Therefore, even when the chamber housing 14a moves downwardly, the wafer W is held in a horizontal position by the roll chucks 1a through 1f. Since the roll chucks 1a through 1f are connected to the chamber housing 14a by the flexible joints 23, the wafer W is prevented from being contaminated by contaminants in the external space.

In the arrangement shown in FIG. 6, the chamber housing 14a is moved downwardly in such a state that the chamber cover 8 is fixedly positioned. However, the chamber housing 14a may be fixedly positioned, and the chamber cover 8 and the upper shaft 6 may be moved upwardly with respect to the chamber housing 14a.

While the peripheral portion of the wafer W is being etched, the supply pipe 3c of the etching unit 2 supplies an etching liquid of hydrofluoric acid or hydrogen peroxide as a first liquid, and the first introduction pipe 9 supplies an inert gas, typically a nitrogen gas, to the surface of the wafer W to protect the surface of the wafer W from the etching liquid. The second introduction pipe 13 supplies an etching liquid of hydrofluoric acid or hydrogen peroxide as a second liquid to the opposite surface of the wafer W, to etch the opposite surface side of the wafer W. After the wafer W is etched, the pipes 3b, 9, 13 supply ultra pure water to clean the wafer W. Thereafter, the pipes 3a, 9, 13 supply an inert gas, typically a nitrogen gas, to the wafer W to dry the wafer W.

The chamber cover 8 has an oxygen concentration sensor 32 mounted thereon, which is electrically connected to an oxygen concentration meter 33. An inert gas is introduced into the chamber 14 to expel oxygen from the chamber 14. A concentration of oxygen in the chamber 14 is detected by the oxygen concentration sensor 32 and measured by the oxygen concentration meter 33 to keep oxygen at a low concentration level in the chamber 14.

As described above, according to the present invention, a chemical liquid is supplied to a bevel portion of the wafer W while oxygen is being purged from the chamber 14, which is hermetically sealed, by a nitrogen gas ($N_2$). Specifically, a thin metal film formed on the bevel portion of the wafer W is etched, and then the bevel portion of the wafer W is cleaned by ultra pure water and dried quickly by a nitrogen gas blown thereto in an oxygen-free environment. Therefore, the bevel portion of the wafer W can be cleaned without causing water marks on, erosion of, and corrosion of the wafer W.

The lower disk 11 is effective to reduce an amount of a processing liquid supplied through the second introduction pipe 13, e.g., hydrofluoric acid or hydrogen peroxide, to a relatively small amount. When a nitrogen gas is supplied through the second introduction pipe 13, its amount can also be kept to a relatively small amount while efficiently drying the bevel portion of the wafer W.

By virtue of the upper disk 10, a relatively small amount of nitrogen gas can be supplied to the gap between the upper disk 10 and the surface of the wafer W to effectively protect the surface of the wafer W from an etching liquid. When the surface of the wafer W is cleaned after the bevel portion thereof is etched, a cleaning liquid of IPA (isopropyl alcohol) or DIW (deionized water as ultra pure water) is supplied to the gap between the upper disk 10 and the surface of the wafer W. Therefore, an amount of such a cleaning liquid can be kept to a relatively small amount.

As described above, a thin metal film formed on the bevel portion and opposite surface of the wafer W are removed basically by a chemical etching process with use of a chemical liquid. Therefore, it is necessary to rinse the bevel portion and opposite surface of the wafer W to remove applied chemical liquid. The applied chemical liquid is typically removed by ultra pure water. Some metals or metal compounds to be removed may be eroded or corroded by ultra pure water. Copper for use as an interconnection material has preferably been used in the art because its specific electric resistance is very low and it has a high resistance to electromigration. However, it has often been observed that a thin film of copper is eroded by ultra pure water applied to rinse the wafer, because a mist of a mixture of an acid and hydrogen peroxide reaches the thin film of copper on the surface of the wafer while the bevel portion and opposite surface of the wafer are being etched, and also because a co-existence of water and oxygen is unavoidable.

Therefore, even if a chemical liquid is replaced with a cleaning liquid, water marks are problematically produced on a surface of the thin film of copper to which mist has been applied. The substrate processing apparatus according to the present invention can eliminate the above drawbacks.

Figure 7:
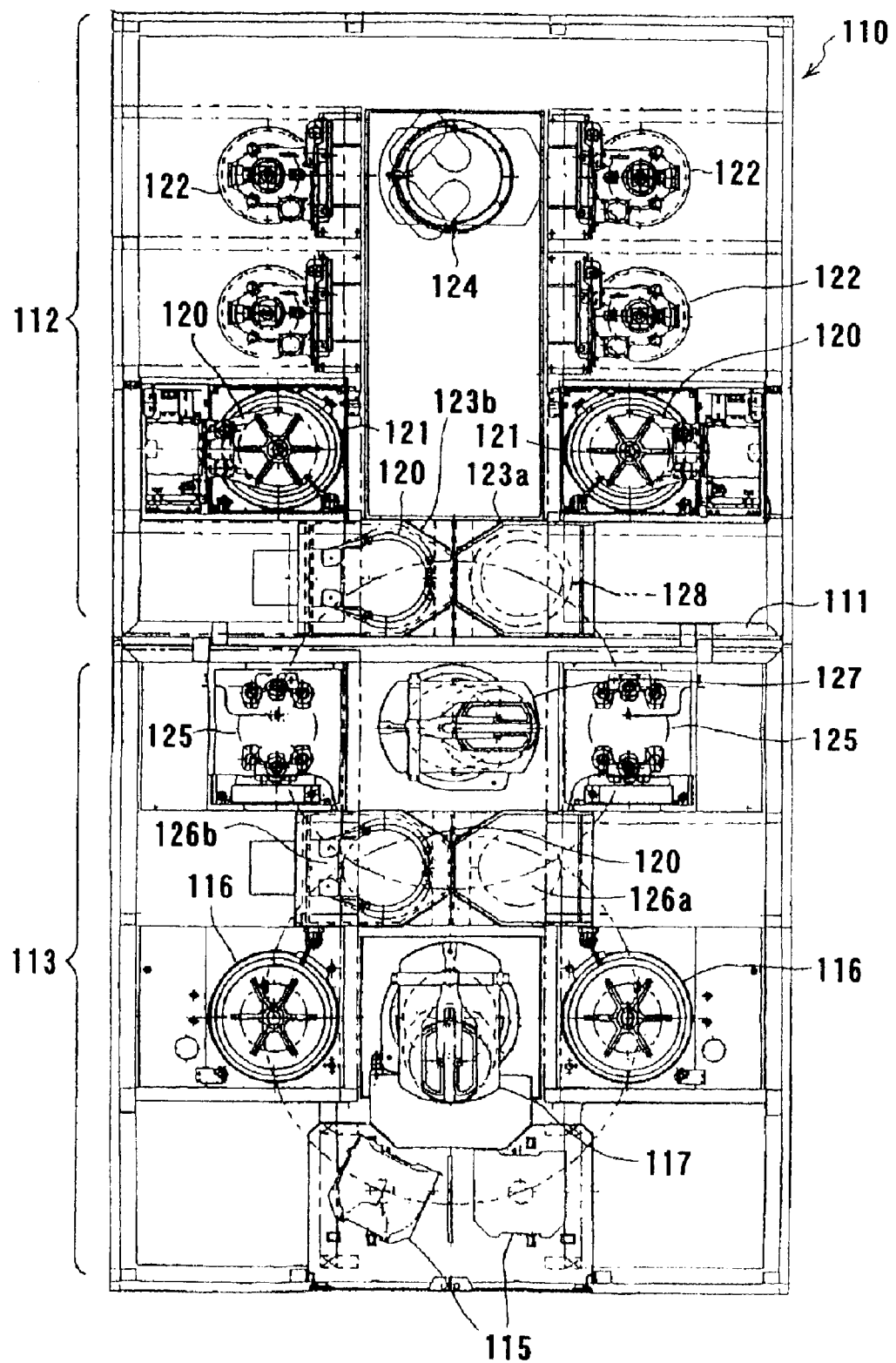
FIG. 7 is a plan view showing a plating apparatus which incorporates the substrate cleaning device of the present invention.

A plating apparatus for plating semiconductor substrates with copper, which incorporates the above substrate cleaning device, will be described below with reference to FIG. 7. As shown in FIG. 7, the plating apparatus is installed in a rectangular housing unit 110 for plating semiconductor substrates successively. The housing unit 110 is divided into a plating space 112 and a clean space 113 by a partition wall 111. Air can be supplied to and discharged from the plating space 112 and the clean space 113 independently of each other. The partition wall 11 has an openable/closable shutter (not shown) incorporated therein. Air pressure in the clean space 113 is lower than atmospheric pressure and higher than air pressure in the plating space 112, so that air in the clean space 113 does not flow out of the housing unit 110 and air in the plating space 112 does not flow into the clean space 113.

The clean space 113 houses therein two cassette stages 115 for placing a substrate storage cassette thereon, two cleaning/drying devices 116 for cleaning (rinsing) a plated substrate with ultra pure water and then drying a cleaned substrate, and a fixed-type rotatable first transfer device (tetraxial robot) 117 for transferring the substrate. Each of the cleaning/drying devices 116 comprises a device having a cleaning liquid supply nozzle for supplying ultra pure water to a surface and opposite surface of a substrate, and a mechanism for spinning the substrate at a high speed to de-water and dry the substrate.

The plating space 112 houses therein two pre-treatment units 121 for pre-treating a substrate before a plating process and inverting a pre-treated substrate with respective inverters 120, four plating units 122 for plating surfaces of the substrate with copper in such a state that a surface to be plated faces downwardly, two first substrate stages 123a, 123b for placing and holding the substrate thereon, and a mobile-type rotatable second transfer device (tetraxial robot) 124 for transferring the substrate.

The clean space 113 also houses therein two substrate cleaning devices 125 for cleaning a plated substrate with a chemical liquid such as an acid solution or an oxidizing agent solution, two second substrate stages 126a, 126b positioned between the substrate cleaning devices 125 and the cleaning/drying devices 116, and a fixed-type rotatable third transfer device (tetraxial robot) 127 positioned between the substrate cleaning devices 125 for transferring the substrate.

Each of the first substrate stage 123b and the second substrate stage 126b is capable of rinsing a substrate with water, and has inverter 120 for inverting a substrate.

The first transfer device 117 transfers a substrate between cassettes placed on the cassette stages 115, the cleaning/drying devices 116, and the second substrate stages 126a, 126b. The second transfer device 124 transfers a substrate between the first substrate stages 123a, 123b, the pre-treatment units 121, and the plating units 122. The third transfer device 127 transfers a substrate between the first substrate stages 123a, 123b, the substrate cleaning devices 125, and the second substrate stages 126a, 126b.

The housing unit 110 also includes a container 128 positioned downwardly of the first substrate stage 123a for accommodating substrates for trial operations. The second transfer device 124 removes a substrate for a trial operation from the container 128, and returns it to the container 128 after the trial operation. Thus, since the housing unit 110 includes therein the container 128 for accommodating substrates for trial operations, the housing unit is prevented from suffering contaminations and throughput reductions which would otherwise occur if substrates for trial operations were introduced from outside of the housing unit 110.

As long as the substrates for trial operations can be removed from the container 128 or supplied into the container 128 by any transfer device, the container 128 may be placed anywhere in the housing unit 110. However, if the container 128 is positioned in the vicinity of the first substrate stage 123a, a trial operation of the plating apparatus using a substrate for the trial operation can be started from a pre-treatment process, then a plating process can be carried out, and the substrate for the trial operation can be returned into the container 128 after being cleaned and dried.

A pre-treatment unit for pre-treating a substrate to improve wettability thereof during a plating process may be dispensed with. A pre-plating unit for pre-plating a substrate to reinforce a seed layer applied to the substrate before a plating process may be employed instead of one of the plating units or one of the pre-treatment units. In this modification, a water rinsing unit is disposed. instead of the pre-treatment unit, for rinsing a substrate with water between a pre-plating process and a plating process and/or after the plating process.

In the present embodiment, the transfer device 117 has two recess-type hands, respectively for supporting a peripheral edge of a substrate by a recess. An upper hand is used for handling a dry substrate an a lower hand is used for handling a wet substrate. Each of the transfer devices 124 and 127 has two recess-type hands, which are used for handling a wet substrate. Hands of the transfer devices are not limited to the above types.

A sequence of operations of the plating apparatus shown in FIG. 7 will be described below. Substrates are accommodated by a substrate cassette in such a state that a surface of a substrate (surface on which semiconductor elements are formed, i.e., surface to be processed) faces upwardly, and the substrate cassette accommodating such substrates is placed on one of the cassette stages The first transfer device 117 removes the substrate from the substrate cassette, moves to the second substrate stage 126a, and places the substrate on the second substrate stage 126a.

Then, the third transfer device 127 transfers the substrate from the second substrate stage 126a to the first substrate stage 123a. Thereafter, the second transfer device 124 receives the substrate from the first substrate stage 123a and transfers the substrate to pre-treatment unit 121. After pre-treatment of the substrate is completed in the pre-treatment unit 121, the substrate is inverted by inverter 120 so that the surface of the substrate faces downwardly, and is then transferred back to the second transfer device 124. The second transfer device 124 transfers the substrate to a head of one of the plating units 122.

After the substrate is plated and liquid is removed from the substrate in the plating unit 122, the substrate is received by the second transfer device 124, which transfers the substrate to the first substrate stage 123b. The substrate is inverted by the inverter 120 provided in the first substrate stage 123b so that the surface of the substrate faces upwardly, and then transferred to substrate cleaning device 125 by the third transfer device 127. In the substrate cleaning device 125, the substrate is cleaned with a chemical liquid and rinsed with pure water, and then liquid is removed from the substrate by spinning the substrate. Thereafter, the substrate is transferred to the second substrate stage 126b by the third transfer device 127. Next, the first transfer device 117 receives the substrate from the second substrate stage 126b, and transfers the substrate to the cleaning/drying device 116. In the cleaning/drying device 116, the substrate is rinsed with pure water and then spin-dried. The dried substrate is returned to the substrate cassette placed on the cassette stage 115 by the first transfer device 117.

Pre-treatment in the pre-treatment units 121 may be dispensed with. When a pre-plating unit is installed, a substrate removed from the cassette is pre-plated by the pre-plating unit, rinsed with water or not rinsed with water, and then plated by one of the plating units. The plated substrate is then rinsed with water or not rinsed with water, and transferred to the substrate cleaning device.

Since the plating apparatus incorporates substrate cleaning device 125, a peripheral portion of a plated substrate or wafer can efficiently be cleaned while the substrate is being protected.

According to the present invention, as described above, roll chucks can hold and rotate substrate or wafer W, and a hermetically sealed chamber having a gas introduction pipe for introducing a gas into the chamber can place the substrate W held by the roll chucks in gas introduced into the chamber. A processing unit, i.e., an etching unit, can etch or clean a peripheral portion of the substrate while the substrate is being rotated by the roll chucks. Liquid supply pipes connected to the processing unit can supply liquids to the processing unit. A substrate processing apparatus can thus efficiently process the peripheral portion of the substrate while protecting the substrate with a gas supplied thereto.

Although certain preferred embodiments of the present invention have been shown and described in detail, it should be understood that various changes and modifications may be made therein without departing from the scope of the appended claims.

what is claimed is:

1. A substrate processing apparatus for processing a substrate, comprising:
    a plurality of chuck mechanisms rotatable about their axes, respectively, for holding a substrate and rotating the substrate about an axis that is parallel to said axes of said plurality of chuck mechanisms, with said axes of said plurality of chuck mechanisms being positioned near a peripheral portion of the substrate when held by said plurality of chuck mechanisms;
    a closable chamber housing said plurality of chuck mechanisms therein;
    a cover for closing said closable chamber;
    a first flat plate disposed above and parallel to a surface of the substrate while the substrate is held by said plurality of chuck mechanisms;
    a gas introduction passage for introducing a gas into said closable chamber;
    a linearly movable processing unit for processing a peripheral portion of the substrate while the substrate is rotated by said plurality of chuck mechanisms; and
    a first supply passage for supplying a first liquid to said linearly movable processing unit.

2. The substrate processing apparatus according to claim 1, wherein said gas introduction passage comprises:
    a first gas introduction pipe which is opened at a surface of the substrate while the substrate is held by said plurality of chuck mechanisms;
    a first gas nozzle connected to said first gas introduction pipe;
    a second gas introduction pipe which is opened at an opposite surface of the substrate while the substrate is held by said plurality of chuck mechanisms, said first gas introduction pipe and said second gas introduction pipe being independent of each other; and
    a second gas nozzle connected to said second gas introduction pipe.

3. The substrate processing apparatus according to claim 1, further comprising:
    a first pure water nozzle which is opened at a surface of the substrate while the substrate is held by said plurality of chuck mechanisms; and
    a second pure water nozzle which is opened at an opposite surface of the substrate while the substrate is held by said plurality of chuck mechanisms, said first pure water nozzle and said second pure water nozzle being independent of each other.

4. The substrate processing apparatus according to claim 1, wherein said first supply passage is for supplying a first liquid to said linearly movable processing unit by supplying at least one of a mineral acid and an organic acid, or an oxidizing agent, to said linearly movable processing unit.

5. The substrate processing apparatus according to claim 1, wherein said first supply passage is for supplying a first liquid to said linearly movable processing unit by supplying at least one of a mineral acid and an organic acid, and an oxidizing agent, alternately to said linearly movable processing unit.

6. The substrate processing apparatus according to claim 1, wherein said gas introduction passage is for introducing a gas into said closable chamber by introducing an inert gas into said closable chamber.

7. The substrate processing apparatus according to claim 1, wherein said horizontally movable processing unit is for processing a peripheral portion of the substrate by etching or cleaning the peripheral portion of the substrate.

8. A substrate processing apparatus for processing a substrate, comprising:
    a plurality of chuck mechanisms rotatable about their axes, respectively, for holding a substrate and rotating the substrate about an axis that is parallel to said axes of said plurality of chuck mechanisms, with said axes of said plurality of chuck mechanisms being positioned near a peripheral portion of the substrate when held by said plurality of chuck mechanisms;
    a processing unit for processing a peripheral portion of the substrate while the substrate is rotated by said plurality of chuck mechanisms;
    a first supply passage for supplying a first liquid to said processing unit;
    a closable chamber housing said plurality of chuck mechanisms therein;
    a cover for closing said closable chamber;
    a first flat plate disposed above and parallel to a surface of the substrate while the substrate is held by said plurality of chuck mechanisms; and
    a second supply passage for supplying at least one of a second liquid for processing the surface of the substrate, and a gas for protecting the surface of the substrate, to a gap between the surface of the substrate and said first flat plate while the substrate is held by said plurality of chuck mechanisms.

9. The substrate processing apparatus according to claim 8, further comprising:
a gas introduction passage for introducing a gas into said closable chamber.

10. The substrate processing apparatus according to claim 9, wherein said gas introduction passage comprises:
said second supply passage, which is opened at the surface of the substrate while the substrate is held by said chuck assembly;
a first gas nozzle connected to said second supply passage;
a gas introduction pipe which is opened at an opposite surface of the substrate while the substrate is held by said chuck assembly, said second supply passage and said gas introduction pipe being independent of each other; and
a second gas nozzle connected to said gas introduction pipe.

11. The substrate processing apparatus according to claim 9, wherein said gas introduction pipe is for introducing a gas into said closable chamber by introducing an inert gas into said closable chamber.

12. The substrate processing apparatus according to claim 8, further comprising:
a first pure water nozzle which is opened at the surface of the substrate while the substrate is held by said chuck assembly; and
a second pure water nozzle which is opened at an opposite surface of the substrate while the substrate is held by said chuck assembly, said first pure water nozzle and said second pure water nozzle being independent of each other.

13. The substrate processing apparatus according to claim 8, wherein said first supply passage is for supplying a first liquid to said processing unit by supplying at least one of a mineral acid and an organic acid, or an oxidizing agent, to said processing unit.

14. The substrate processing apparatus according to claim 8, wherein said second supply passage is for supplying at least one of a second liquid and a gas to the surface of the substrate by supplying at least one of pure water and the gas to the surface of the substrate.

15. The substrate processing apparatus according to claim 8, wherein said first supply passage is for supplying a first liquid to said processing unit by supplying at least one of a mineral acid and an organic acid, and an oxidizing agent, alternately to said processing unit.

16. The substrate processing apparatus according to claim 8, wherein said processing unit is for processing a peripheral portion of the substrate by etching or cleaning the peripheral portion of the substrate.

17. The substrate processing apparatus according to claim 8, further comprising:
a second flat plate disposed beneath and parallel to an opposite surface of the substrate while the substrate is held by said chuck assembly; and
a third supply passage for supplying at least one of a liquid and a gas to a gap between the opposite surface of the substrate and said second flat plate while the substrate is held by said chuck assembly.

18. The substrate processing apparatus according to claim 17, wherein a combination of said second supply passage and said third supply passage define a gas introduction passage for introducing a gas into said closable chamber.

19. The substrate processing apparatus according to claim 18, wherein
said second supply passage is opened at the surface of the substrate while the substrate is held by said chuck assembly,
said third supply passage is opened at the opposite surface of the substrate while the substrate is held by said chuck assembly, and
said gas introduction passage includes a nozzle connected to said second supply passage and a nozzle connected to said third supply passage.

20. The substrate processing apparatus according to claim 18, wherein
said gas introduction passage is for introducing a gas into said closable chamber by introducing an inert gas into said closable chamber.

21. The substrate processing apparatus according to claim 17, wherein
said second supply passage is opened at the surface of the substrate while the substrate is held by said chuck assembly and defines a first pure water nozzle,
said third supply passage is opened at the opposite surface of the substrate while the substrate is held by said chuck assembly and defines a second pure water nozzle,
with said first pure water nozzle and said second pure water nozzle being independent of each other.

22. The substrate processing apparatus according to claim 17, wherein
said first supply passage is for supplying a first liquid to said processing unit by supplying at least one of a mineral acid and an organic acid, or an oxidizing agent, to said processing unit.

23. The substrate processing apparatus according to claim 17, wherein
said third supply passage is for supplying at least one of a liquid and a gas to a gap between the opposite surface of the substrate and said second flat plate by supplying at least one of
(i) at least one of a mineral acid and an organic acid, or an oxidizing agent, and
(ii) the gas
to the gap between the opposite surface of the substrate and said second flat plate.

24. The substrate processing apparatus according to claim 17, wherein
said first supply passage is for supplying a first liquid to said processing unit by supplying at least one of a mineral acid and an organic acid, and an oxidizing agent, alternately to said processing unit.

25. The substrate processing apparatus according to claim 17, wherein
said third supply passage is for supplying at least one of a liquid and a gas to a gap between the opposite surface of the substrate and said second flat plate by supplying at least one of
(i) at least one of a mineral acid and an organic acid, and an oxidizing agent, alternately to the gap between the opposite surface of the substrate and said second flat plate, and
(ii) the gas to the gap between the opposite surface of the substrate and said second flat plate.

26. The substrate processing apparatus according to claim 17, wherein said processing unit is for processing a peripheral portion of the substrate by etching or cleaning the peripheral portion of the substrate.

27. The substrate processing apparatus according to claim 17, wherein
   said second supply passage is positioned inwardly of an outer periphery of said first flat plate, and
   said third supply passage is positioned inwardly of an outer periphery of said second flat plate.

28. The substrate processing apparatus according to claim 8, wherein
   said second supply passage is positioned inwardly of an outer periphery of said first flat plate.

* * * * *